(12) United States Patent
Yang et al.

(10) Patent No.: US 11,784,159 B2
(45) Date of Patent: Oct. 10, 2023

(54) MASS TRANSFER DEVICE AND MASS TRANSFER METHOD

(71) Applicant: CHONGQING KONKA PHOTOELECTRIC TECHNOLOGY RESEARCH INSTITUTE CO., LTD., Chongqing (CN)

(72) Inventors: Jan-hsiang Yang, Chongqing (CN); Kai-yi Wu, Chongqing (CN); Chia-hui Shen, Chongqing (CN); Jen-chieh Chiang, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 341 days.

(21) Appl. No.: 17/315,279

(22) Filed: May 8, 2021

(65) Prior Publication Data
US 2021/0351154 A1 Nov. 11, 2021

Related U.S. Application Data

(63) Continuation of application No. PCT/CN2019/125795, filed on Dec. 17, 2019.

(51) Int. Cl.
*H01L 23/00* (2006.01)
*H01L 33/00* (2010.01)
(Continued)

(52) U.S. Cl.
CPC .............. *H01L 24/75* (2013.01); *H01L 24/83* (2013.01); *H01L 24/97* (2013.01);
(Continued)

(58) Field of Classification Search
None
See application file for complete search history.

(56) References Cited

U.S. PATENT DOCUMENTS

2019/0139932 A1  5/2019  Ting et al.
2019/0333791 A1  10/2019  Hussell et al.
2021/0219476 A1*  7/2021  Chen .................. H05K 13/0465

FOREIGN PATENT DOCUMENTS

CN   108461439 A   8/2018
CN   108767092 A   11/2018
(Continued)

OTHER PUBLICATIONS

Corresponding CN search report dated May 17, 2021 re: Application No. 201980003336.4.
(Continued)

*Primary Examiner* — Robert K Carpenter
(74) *Attorney, Agent, or Firm* — Gang Yu

(57) ABSTRACT

Provided are a mass transfer device and a mass transfer method. The mass transfer device is provided with multiple channels, a first opening of each channel is arranged on a first surface of the mass transfer device, a second opening of each channel is arranged on a second surface of the mass transfer device, and the distances between the channels are gradually increased along a direction from the first surface to the second surface. In the provided mass transfer method, through a laser irradiation mode, the Micro-LEDs are separated from the first substrate and enter the channels of the mass transfer device through the first openings, and falling into Micro-LED to-be-installed positions on a second substrate through the second openings of the channels, thereby transferring the Micro-LEDs from the first substrate to the second substrate.

20 Claims, 3 Drawing Sheets

(51) Int. Cl.
*H01L 25/075* (2006.01)
*H01L 33/32* (2010.01)

(52) U.S. Cl.
CPC ...... *H01L 25/0753* (2013.01); *H01L 33/0093* (2020.05); *H01L 33/32* (2013.01); *H01L 2224/75724* (2013.01); *H01L 2224/75744* (2013.01); *H01L 2224/75754* (2013.01); *H01L 2224/83005* (2013.01); *H01L 2224/83136* (2013.01); *H01L 2224/83192* (2013.01); *H01L 2224/95001* (2013.01); *H01L 2224/951* (2013.01); *H01L 2224/95136* (2013.01)

(56) References Cited

FOREIGN PATENT DOCUMENTS

| CN | 109273387 A | 1/2019 |
| CN | 109390263 A | 2/2019 |
| CN | 109950194 A | 6/2019 |
| CN | 110379739 A | 10/2019 |
| CN | 110379758 A | 10/2019 |

OTHER PUBLICATIONS

International Search Report for corresponding application PCT/CN2019/125795 filed Dec. 17, 2019; dated Sep. 22, 2020.

\* cited by examiner

```
┌─────────────────────────────────────────────────────────┐
│ a first substrate with multiple Micro-LEDs is placed above a first │  ─ S100
│ surface of the mass transfer device, and each Micro-LED on the    │
│ first substrate respectively corresponds to each first opening on │
│                the mass transfer device                            │
└─────────────────────────────────────────────────────────┘
                              │
                              ▼
┌─────────────────────────────────────────────────────────┐
│ a second substrate is placed below a second surface of the mass   │  ─ S200
│ transfer device, and each Micro-LED to-be-installed position on   │
│ the second substrate corresponds to each second opening on the    │
│                   mass transfer device                             │
└─────────────────────────────────────────────────────────┘
                              │
                              ▼
┌─────────────────────────────────────────────────────────┐
│ one side, away from the Micro-LEDs, of the first substrate is     │
│ irradiate by using a laser, so that the multiple Micro-LEDs are   │  ─ S300
│ separated from the first substrate and enter the channels of the  │
│ mass transfer device through the first openings, and fall into the│
│ Micro-LED to-be-installed positions on the second substrate via   │
│                    the second openings                             │
└─────────────────────────────────────────────────────────┘
```

Fig. 3

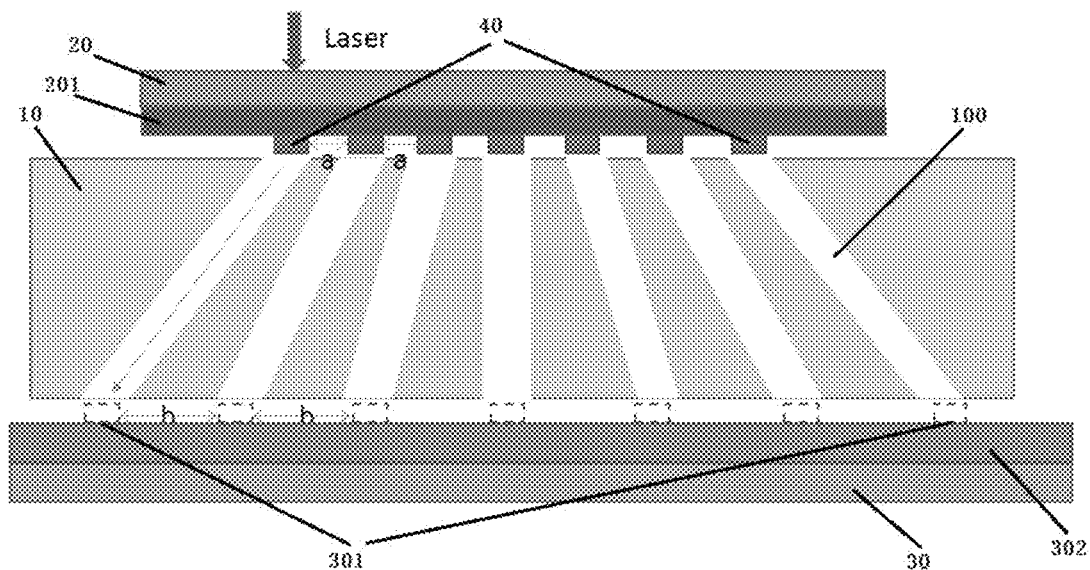

Fig. 4

MASS TRANSFER DEVICE AND MASS TRANSFER METHOD

TECHNICAL FIELD

The present disclosure relates to the technical field of Micro-Light Emitting Diode (LED) processing, and in particular to a mass transfer device and mass transfer method.

BACKGROUND

A Micro-LED technology is a new generation of a display technology, and a mass transfer technology thereof is an important part of Micro-LED manufacturing. The Micro-LED mass transfer technology is a technology of transferring thousands of MICRO-LEDs from a carrier substrate to a target substrate, and a primary problem to be solved by mass transfer is that: a spacing distance between the Micro-LEDs is changed from a spacing distance on the carrier substrate into a spacing distance on the target substrate. However, a method for mass transfer in a related art, such as, complicated operations and high costs, is not beneficial to the development of the Micro-LED technology.

Therefore, the related art needs to be improved and developed.

SUMMARY

A technical problem to be solved by the present disclosure is to provide a mass transfer device and method in view of the above disadvantages in the related art, and aim to solve a problem in the related art that the mass transfer method is complicated in operation.

A technical scheme provided by the embodiments of the present disclosure for solving the technical problem is as follows.

According to an embodiment of the present disclosure, a mass transfer device is provided. The mass transfer device is provided with multiple channels of which two ends are opened, and each channel includes a first opening and a second opening, the first opening of each channel is installed on a first surface of the mass transfer device, the second opening of each channel is installed on a second surface opposite to the first surface, and a distance between the channels is gradually increased along a direction from the first surface to the second surface.

In an embodiment, in the mass transfer device, the channels are straight lines.

According to another embodiment of the present disclosure, a mass transfer method applied to the mass transfer device as mentioned above is provided, which is used for transferring Micro-LEDs from a first substrate to a second substrate, and the mass transfer method includes the following steps: the first substrate with multiple Micro-LEDs is placed above a first surface of the mass transfer device, and each Micro-LED on the first substrate respectively corresponds to each first opening on the mass transfer device; the second substrate is placed below a second surface of the mass transfer device, and each Micro-LED to-be-installed position on the second substrate corresponds to each second opening on the mass transfer device; one side, away from the Micro-LEDs, of the first substrate is irradiated by using a laser, so that the multiple Micro-LEDs on the first substrate are separated and respectively enter the channels of the mass transfer device through the first openings, and fall into the Micro-LED to-be-installed positions on the second substrate via the second openings.

In an embodiment, the first substrate is a transparent substrate.

In an embodiment, the second substrate is provided with a connection material, after the Micro-LEDs falling into the Micro-LED to-be-installed positions on the second substrate, the method further includes: the Micro-LEDs are fixed on the second substrate by the connection material.

In an embodiment, the connection material is a welding flux.

In an embodiment, the material of a portion, connected with the first substrate, of the Micro-LED is GaN.

In an embodiment, the first substrate is a growing substrate of the Micro-LEDs.

In an embodiment, the Micro-LEDs are connected with the first substrate by photolytic glue.

In an embodiment, before the first substrate is placed above the first surface of the mass transfer device, the method further includes: the Micro-LEDs on the growing substrate are transferred to the first substrate.

In an embodiment, when the Micro-LED is in a state of connecting with the first substrate, an existing electrode of the Micro-LED faces to one side away from the first substrate.

In an embodiment, the step of transferring the Micro-LEDs on the growing substrate to the first substrate includes: a glue material is installed on a third substrate, and the Micro-LEDs on the growing substrate are glued to the third substrate by the glue material; the photolytic glue is installed on the first substrate, and the Micro-LEDs on the third substrate are glued to the first substrate by the photolytic glue.

In an embodiment, the second substrate is provided with through holes, before one side, away from the Micro-LEDs, of the first substrate is irradiated by using the laser, the method further includes: a vacuum device is installed below the second substrate, and vacuum is formed below the second substrate by the vacuum device.

In an embodiment, the through holes are installed corresponding to the Micro-LED to-be-installed positions on the second substrate.

In an embodiment, before one side, away from the Micro-LEDs, of the first substrate is irradiated by using the laser, the method further includes: an electrostatic chuck is installed below the second substrate.

In an embodiment, the material of the mass transfer device is an anti-static material.

The mass transfer device in the above embodiments of the present disclosure is provided with the multiple channels, and the distances between the channels are gradually increased along the direction from the first opening of the channel to the second opening. In the mass transfer method provided by the embodiments of the present disclosure, through a laser irradiation mode, the Micro-LEDs are separated from the first substrate and enter the channels of the mass transfer device via the first openings, and falling into the Micro-LED to-be-installed positions on the second substrate through the second openings of the channels, thereby transferring the Micro-LEDs from the first substrate to the second substrate. In addition, the spacing distance on the second substrate is greater than the spacing distance on the first substrate. the mass transfer process is simple, and the cost is low.

BRIEF DESCRIPTION OF THE DRAWINGS

FIG. 3 is a flowchart of a mass transfer method according to an embodiment of the present disclosure.

FIG. 4 is a schematic diagram of an implementation mode of the mass transfer method according to an embodiment of the present disclosure.

DETAILED DESCRIPTION OF THE EMBODIMENTS

Figure 1:
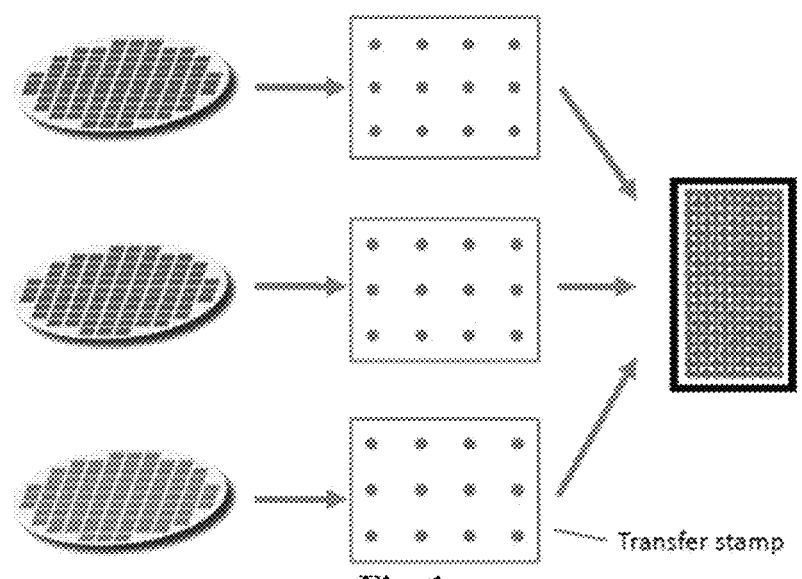
FIG. 1 is a schematic diagram of a Micro-LED mass transfer technology according to the related art.

It is discovered by the inventor that in a process of Micro-LED mass transfer, a Micro-LED spacing distance on a target substrate is often greater than a Micro-LED spacing distance on an original substrate, for example, in a production process of a Micro-LED display panel as shown in FIG. 1, three colors of red, blue and green Micro-LEDs are respectively generated on each growing substrate thereof, in order to achieve color display of the display panel, it is necessary to respectively transfer the three colors of the red, blue and green Micro-LEDs from the original growing substrate to a display backplane, so a spacing distance between Micro-LEDs needs to be changed. In the related art, there is no simple Micro-LED mass transfer method, a cost of the Micro-LED mass transfer is high, and it is not beneficial to the development of a Micro-LED technology.

The present disclosure provides a mass transfer device and a mass transfer method, and aims to achieve a mass transfer technology which is simple and low in cost. In order to make purposes, technical schemes and advantages of the disclosure more clear and definite, the disclosure is further described in detail below with reference to drawings and embodiments. It should be understood that the specific embodiments described here are only used to explain the disclosure, but not used to limit the disclosure.

Embodiment One

Figure 2:
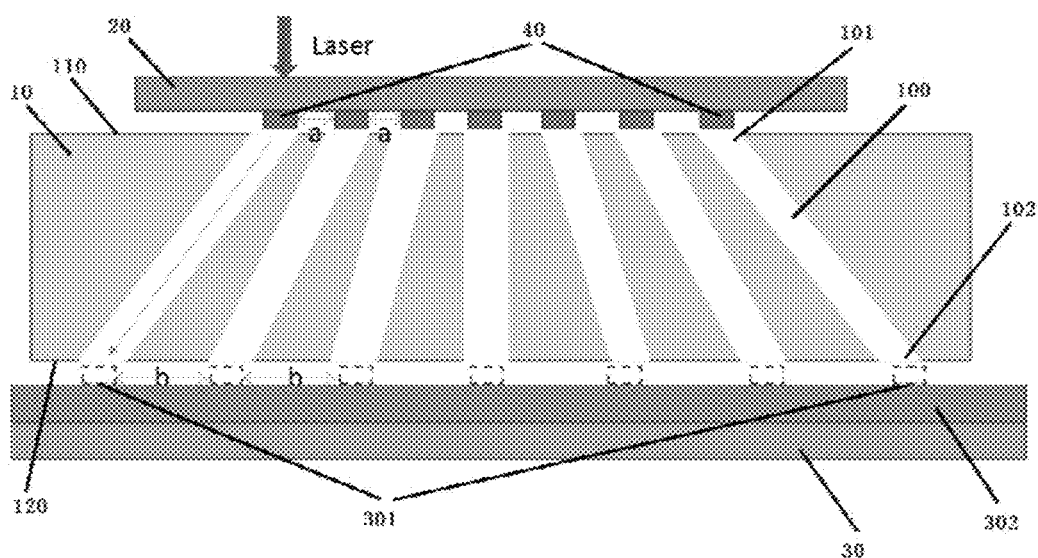
FIG. 2 is a usage sectional view of a mass transfer device according to an embodiment of the present disclosure.

In the embodiment one of the present disclosure, a mass transfer device is provided, as shown in FIG. 2, the mass transfer device is block-shaped, FIG. 2 is a usage sectional view of the mass transfer device, the mass transfer device 10 is provided with multiple channels 100 of which two ends are opened, each channel 100 includes two openings: a first opening 101 and a second opening 102, each first opening 101 is installed on a first surface 110 of the mass transfer device, each second opening 102 is installed on a second surface 120 opposite to the first surface 110, and a distance between the channels 100 is gradually increased along a direction from the first surface 110 to the second surface 120. It is not difficult to see that because the distance between the channels 100 is gradually increased along the direction from the first surface 110 to the second surface 120, a distance between the first openings 101 installed on the first surface 110 is less than a distance between the second openings 102 installed on the second surface 120, namely a in the figure is less than b in the figure. It is not difficult to see that while the mass transfer device is applied to perform mass transfer, as shown in FIG. 2, if Micro-LEDs 40 on a first substrate 20 enter the channels 100 from the first openings 101, leave the channels from the second openings 102 and fall into a second substrate 30, a spacing distance between the Micro-LEDs 40 falling into the second substrate 30 is greater than a spacing distance between the Micro-LEDs 40 on the first substrate 20.

The channel 100 can be a straight line, or can be a curved line. The channel 100 is a straight line preferably. In this way, the Micro-LEDs 40 may be less disturbed by an inner wall of the channel 100 while being moved in the channel 100.

Embodiment Two

Based on the mass transfer device in the above embodiments, a mass transfer method is provided by the embodiment two, and the method is used for transferring Micro-LEDs from a first substrate to a second substrate, as shown in FIG. 3, the mass transfer method includes the following steps.

At S100, the first substrate with multiple Micro-LEDs is placed above a first surface of the mass transfer device, and each Micro-LED on the first substrate respectively corresponds to each first opening on the mass transfer device.

At S200, the second substrate is placed below a second surface of the mass transfer device, and each Micro-LED to-be-installed position on the second substrate corresponds to each second opening on the mass transfer device.

Specifically, as shown in FIG. 2, while the Micro-LEDs 40 on the first substrate 20 is transferred to the second substrate 30 by using the mass transfer method provided by the present embodiment, according to the previous description of the mass transfer device, the spacing distance between the first openings of the mass transfer device is different from the spacing distance between the second openings so that it is achieved that the spacing distance between the Micro-LEDs is changed while the Micro-LEDs are transferred, but in the present field, the spacing distance between the Micro-LEDs needs to be increased during the Micro-LED mass transfer, therefore, the first substrate 20 is placed above the mass transfer device 10, and a position of the first substrate 20 is adjusted, so that each Micro-LED 40 on the first substrate 20 respectively corresponds to the first opening 101, and the second substrate 30 is placed below the mass transfer device 10, and a position of the second substrate 30 is adjusted, so that each Micro-LED to-be-installed position 301 on the second substrate 30 respectively corresponds to the second opening 102. The Micro-LED to-be-installed position 301 is a position of the Micro-LED to be installed on the second substrate.

In actual implementation, for the different second substrates, there may be different Micro-LED installation requirements, namely the arrangement of the Micro-LED to-be-installed positions is also different, similarly, for the different first substrates, the arrangement of the Micro-LEDs on the first substrate may also be different. It is not difficult to see that in the present embodiment, for the different second substrates and first substrates, the mass transfer device may be specifically configured, and the distance between the channels is changed so that the first openings and the second openings of the mass transfer device may respectively correspond to the Micro-LEDs on the first substrate and the Micro-LED to-be-installed positions on the second substrate.

Referring to FIG. 3, the mass transfer method further includes the following steps.

At S300, one side, away from the Micro-LEDs, of the first substrate is irradiated by using a laser, so that the multiple Micro-LEDs are separated from the first substrate and respectively enter the channels of the mass transfer device via the first openings, and fall into the Micro-LED to-be-installed positions on the second substrate through the second openings.

In the present embodiment, the first substrate is a transparent substrate. While one side, away from the Micro-LEDs, of the first substrate is irradiated by using the laser, the laser may reach the other side of the first substrate through the first substrate, namely the side with the Micro-LEDs. It is not difficult to see that while one side with the Micro-LEDs is irradiated by the laser, as long as a material of a portion, connected with the first substrate, of the Micro-LED is a material of which connection ability decreases or disappears after being irradiated by the laser, the Micro-LEDs may fall off from the first substrate.

In another implementation mode, the material of the portion, connected with the first substrate, of the Micro-LED on the first substrate is GaN. The GaN may be partially decomposed to generate a nitrogen gas ($2GaN \rightarrow 2Ga+N_2\uparrow$) while being irradiated by the laser, and the nitrogen gas generates a thrust. Therefore, while the material of the portion, connected with the first substrate, of the Micro-LED is the GaN, and one side, away from the Micro-LED, of the first substrate is irradiated by using the laser, the laser may pass through the transparent first substrate, and irradiate one side of the Micro-LED, the GaN of a connection portion between the Micro-LED and the first substrate may be partially decomposed to generate the nitrogen gas, and the Micro-LED is pushed away from the first substrate, and falls off from the first substrate. The Micro-LED is grown and generated on a growing substrate (usually a transparent sapphire substrate) by a Metal-organic Chemical Vapor Deposition method (MOCVD), for certain colors of LEDs, for example, a blue-green Micro-LED, the growing substrate thereof is transparent, and the material of the connection portion thereof with the growing substrate is the CaN. In this way, the first substrate may be the growing substrate of the Micro-LEDs, in other words, it may be achieved that the Micro-LEDs are directly massively transferred from the growing substrate to the second substrate, and the spacing distance between the Micro-LEDs is changed at the same time in a transfer process.

As shown in FIG. 2, a connection material 302 may be installed on the second substrate 30, after the Micro-LEDs 40 fall into the Micro-LED to-be-installed positions on the second substrate, the Micro-LEDs 40 are fixed on the second substrate by the connection material 302. Specifically, the connection material is a welding flux such as tin, indium or tin-indium alloy.

In the present art, the Micro-LED includes a semiconductor layer and a quantum hydrazine layer, herein the semiconductor layer includes a N-type semiconductor layer and a P-type semiconductor layer, the quantum hydrazine layer is between the N-type semiconductor layer and the P-type semiconductor layer, and there are an electrode N and an electrode P on the N-type semiconductor layer and the P-type semiconductor layer respectively. The growing substrate of the Micro-LEDs may grow the electrode N and the electrode P, or may only grow the electrode N or only grow the electrode P, it is related to a form of the Micro-LED. For example, a vertical Micro-LED only grows the electrode N or the electrode P on the growing substrate, and a horizontal Micro-LED grows the electrode N and the electrode P on the growing substrate. No matter how does the Micro-LED grow the electrode on the growing substrate, an existing electrode of the Micro-LED on the growing substrate faces to one side away from the growing substrate.

In an implementation mode, while the Micro-LEDs are massively transferred, it is necessary to ensure that the existing electrode of the Micro-LED is in contact with a surface of a backplane transferred, thereby a current path may be formed so that a current may flow through the Micro-LED. In other words, after the Micro-LEDs fall into the Micro-LED to-be-installed positions on the second substrate, the existing electrode of the Micro-LED is in contact with the second substrate.

It is not difficult to see that while the first substrate is the growing substrate, because a direction of the electrode grown on the Micro-LED is a direction away from the first substrate, while the Micro-LEDs fall off from the first substrate and fall into the Micro-LED to-be-installed positions on the second substrate, the existing electrode on the Micro-LED may be in contact with the second substrate, and after being fixed on the second substrate by the connection material, it may be achieved that the current on the second substrate flows through the Micro-LEDs.

The growing substrate of the Micro-LEDs may also not be a transparent substrate. For example, a substrate material of a red Micro-LED is GaAs, and the GaAs has a higher light absorption rate, so the laser may not pass through the growing substrate of the red Micro-LED to achieve that the Micro-LED is peeled from the growing substrate. Therefore, in another possible implementation mode, as shown in FIG. 4, the first substrate 20 is not the growing substrate of the Micro-LEDs 40, the Micro-LEDs 40 are connected with the first substrate 20 by photolytic glue 201, so that while one side, away from the Micro-LEDs, of the first substrate 20 is irradiated by using the laser, the laser passes through the transparent first substrate 20 and reaches the photolytic glue 201, a viscous force of the photolytic glue 201 is reduced after being irradiated by the laser, the Micro-LEDs 40 fall off from the first substrate 20, and fall into the Micro-LED to-be-installed positions 301 on the second substrate 30 through the channels 100 of the mass transfer device 10.

In an implementation mode, before the first substrate is placed above the first surface of the mass transfer device, the method further includes: the Micro-LEDs on the growing substrate are transferred to the first substrate.

It may be observed from the previous description that while the Micro-LEDs are required to be electrified on the second substrate, and the Micro-LEDs are transferred from the growing substrate to the first substrate, it is required that an existing electrode of the Micro-LED faces to one side away from the first substrate while the Micro-LED is in a state in connection with the first substrate, the step that the Micro-LEDs on the growing substrate is transferred to the first substrate specifically includes the following steps.

At S001, a glue material is installed on a third substrate, and the Micro-LEDs on the growing substrate are glued to the third substrate by the glue material.

While the Micro-LEDs on the growing substrate are transferred to the first substrate, because the existing electrode of the Micro-LED faces to one side away from the first substrate while the Micro-LED is on the growing substrate, the Micro-LED is directly glued from the growing substrate to the first substrate, and while the Micro-LED is transferred to the first substrate, the existing electrode of the Micro-LED faces to the first substrate, so while the Micro-LED falls off from the first substrate, and falls into the Micro-LED to-be-installed position on the second substrate, the existing electrode of the Micro-LED is not in contact with the second substrate, and it may not be electrified.

Therefore, in the present embodiment, the third substrate is installed, and the Micro-LEDs on the growing substrate are firstly glued to the third substrate. Specifically, a glue material is installed on the third substrate, one surface, provided with the Micro-LEDs, on the growing substrate is covered by a surface with the glue material, the Micro-LEDs are glued to the third substrate, after that, the first substrate is peeled. Specifically, the first substrate is peeled in a mode such as chemical etching, in this way, the Micro-LEDs are transferred from the growing substrate to the third substrate, and the spacing distance between the Micro-LEDs is not changed.

At S002, the photolytic glue is installed on the first substrate, and the Micro-LEDs on the third substrate are glued to the first substrate by the photolytic glue.

After the Micro-LED is transferred to the third substrate, the existing electrode of the Micro-LED faces to the third substrate, at this moment, one surface, provided with the Micro-LEDs, on the third substrate is covered by the first substrate provided with the photolytic glue, the Micro-LEDs are glued to the first substrate, and the third substrate is peeled. Specifically, the glue material on the third substrate may be the photolytic glue, and the Micro-LEDs are peeled off from the third substrate in a mode of laser irradiation, the glue material on the third substrate may also be other glue materials which may be chemically or physically decomposed, so that the third substrate is peeled. In this way, the Micro-LEDs are transferred from the third substrate to the first substrate, and connected with the first substrate by the photolytic glue, the spacing distance between the Micro-LEDs is the same as the spacing distance between the Micro-LEDs on the growing substrate.

It is not difficult to see from the above description that after two times of gluing, it is achieved that the Micro-LEDs are transferred to the first substrate and connected with the first substrate by the photolytic glue, thereby it may be achieved that while the first substrate is irradiated by the laser, the Micro-LEDs may be separated from the first substrate, and fall into the Micro-LED to-be-installed positions of the second substrate, the existing electrode is in contact with the second substrate.

Because of the inclination of the channels of the mass transfer device, the embodiment of the present disclosure further provides a method for enabling the Micro-LEDs to smoothly and rapidly pass through the channels and fall into the Micro-LED to-be-installed positions.

Figure 5:
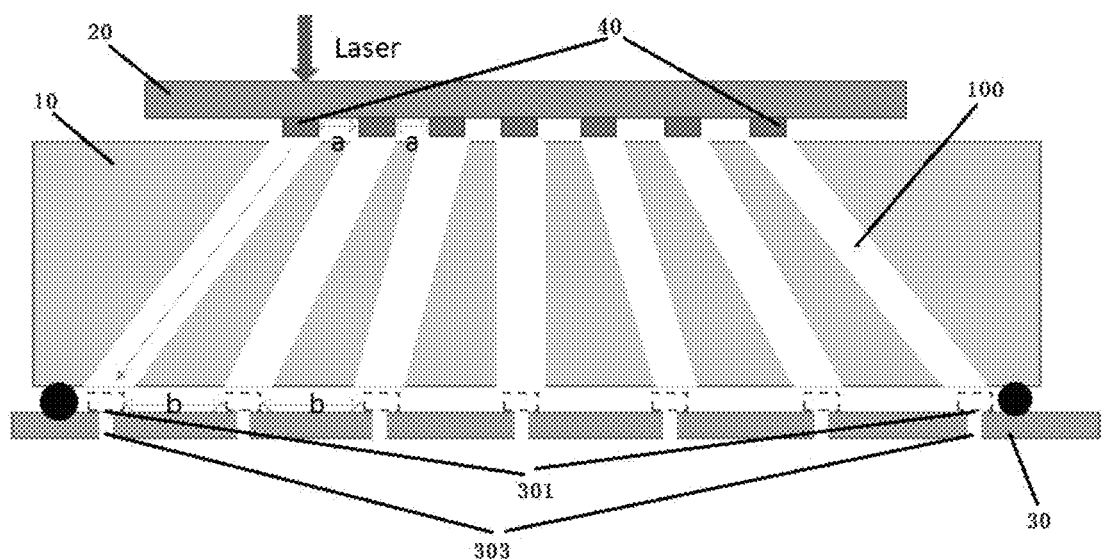
FIG. 5 is a schematic diagram of another implementation mode of the mass transfer method according to an embodiment of the present disclosure.

Specifically, as shown in FIG. 5, in an implementation mode, the second substrate 30 is further provided with through holes 303, before the first substrate is irradiated by using the laser, the method further includes: a vacuum device is installed on the second substrate, and vacuum is formed below the second substrate by the vacuum device.

After the vacuum is formed below the second substrate by the vacuum device, an attraction force is formed through the through holes 30, so that after the Micro-LEDs 40 are separated from the first substrate 20, the Micro-LEDs 40 are subjected to the attraction force while being moved in the channels, thereby the Micro-LEDs 40 are assisted to reach the second substrate more rapidly and smoothly.

Furthermore, the through holes 303 installed in the second substrate 30 may correspond to the Micro-LED to-be-installed positions, so that the attraction force formed by the vacuum device has a better adsorption effect on the Micro-LEDs.

In another implementation mode, before the first substrate is irradiated by using the laser, the method further includes: an electrostatic chuck is installed below the second substrate.

Static electricity may be generated inside the electrostatic chuck by using a dielectric material to store electrical potential energy, after the Micro-LEDs are separated from the first substrate, the Micro-LEDs may be subjected to an adsorption force of the static electricity while being moved in the channels, thereby the Micro-LEDs are assisted to reach the second substrate more rapidly and smoothly.

While the electrostatic chuck installed below the second substrate generates the adsorption force on the Micro-LEDs, further, a material of the mass transfer device may be configured as an anti-static material. For example, the mass transfer device is made of a metal material or the mass transfer device (including surfaces of the channels) is electroplated, so that a surface of the mass transfer device is metalized to achieve an anti-static effect, and the adsorption force of the electrostatic chuck to the Micro-LEDs is avoided from being affected.

In conclusion, the above embodiments of the present disclosure provide a mass transfer device and a mass transfer method. The mass transfer device is provided with the multiple channels, the first opening of each channel is installed on the first surface of the mass transfer device, the second opening of each channel is installed on the second surface of the mass transfer device, and the distances between the channels are gradually increased along the direction from the first surface to the second surface. In the mass transfer method provided by the embodiments of the present disclosure, through the laser irradiation mode, the Micro-LEDs are separated from the first substrate and enter the channels of the mass transfer device through the first openings, and falling into the Micro-LED to-be-installed positions on the second substrate through the second openings of the channels, thereby transferring the Micro-LEDs from the first substrate to the second substrate. In addition, the spacing distance on the second substrate is greater than the spacing distance on the first substrate. A mass transfer process is simple, and a cost is low.

Certainly, it may be understood by those of ordinary skilled in the art that all or part of processes in the methods of the above embodiments may be achieved by a computer program for instructing related hardware (such as a processor, and a controller), the program may be stored in a computer-readable storage medium, the program may include the processes of each method embodiment as mentioned above while being executed. Herein the storage medium may be a memory, a magnetic disk, an optical disk and the like.

It should be understood that the application of the present disclosure is not limited to the above examples, improvements or changes may be made by those of ordinary skill in the art according to the above description, all of these improvements and changes shall fall within a scope of protection of appended claims of the present disclosure.

What is claimed is:

1. A mass transfer device, wherein the mass transfer device is provided with multiple channels of which two ends are opened, each channel comprises a first opening and a second opening, the first opening of each channel is arranged on a first surface of the mass transfer device, the second opening of each channel is arranged on a second surface opposite to the first surface, and distances between the channels are gradually increased along a direction from the first surface to the second surface.

2. The mass transfer device as claimed in claim 1, wherein the channels are straight lines.

3. A mass transfer method, applied to the mass transfer device as claimed in claim 1, and used for transferring Micro-LEDs from a first substrate to a second substrate, wherein the mass transfer method comprises:
    placing the first substrate with multiple Micro-LEDs above the first surface of the mass transfer device, and making each Micro-LED on the first substrate respectively correspond to each first opening on the mass transfer device;
    placing the second substrate below the second surface of the mass transfer device, and making each Micro-LED to-be-installed position on the second substrate respectively correspond to each second opening on the mass transfer device; and
    irradiating one side, away from the Micro-LEDs, of the first substrate by using a laser, so that the multiple Micro-LEDs are separated from the first substrate and respectively entering the channels of the mass transfer device through the first openings, and falling into the Micro-LED to-be-installed positions on the second substrate via the second openings;
    wherein the first substrate is a transparent substrate.

4. The mass transfer method as claimed in claim 3, wherein the second substrate is provided with a connection material, after the Micro-LEDs falling into the Micro-LED to-be-installed positions on the second substrate, the method further comprises:
    fixing the Micro-LEDs on the second substrate by the connection material.

5. The mass transfer method as claimed in claim 4, wherein the connection material is a welding flux.

6. The mass transfer method as claimed in claim 3, wherein a material of a portion, connected with the first substrate, of the Micro-LED is GaN.

7. The mass transfer method as claimed in claim 6, wherein the first substrate is a growing substrate of the Micro-LEDs.

8. The mass transfer method as claimed in claim 3, wherein the Micro-LEDs are connected with the first substrate by photolytic glue.

9. The mass transfer method as claimed in claim 8, wherein before making the first substrate to be placed above the first surface of the mass transfer device, the method further comprises:
    transferring the Micro-LEDs on the growing substrate to the first substrate.

10. The mass transfer method as claimed in claim 9, when the Micro-LED is in a state of connecting with the first substrate, an existing electrode of the Micro-LED faces to one side away from the first substrate.

11. The mass transfer method as claimed in claim 10, wherein transferring the Micro-LEDs on the growing substrate to the first substrate comprises:
    installing a glue material on a third substrate, and enabling the Micro-LEDs on the growing substrate to be glued to the third substrate by the glue material; and
    installing the photolytic glue on the first substrate, and enabling the Micro-LEDs on the third substrate to be glued to the first substrate by the photolytic glue.

12. The mass transfer method as claimed in claim 3, wherein the second substrate is provided with through holes, before irradiating one side, away from the Micro-LEDs, of the first substrate by using the laser, the method further comprises:
    installing a vacuum device below the second substrate, and forming vacuum below the second substrate by the vacuum device.

13. The mass transfer method as claimed in claim 12, wherein the through holes are installed corresponding to the Micro-LED to-be-installed positions on the second substrate.

14. The mass transfer method as claimed in claim 3, wherein before irradiating one side, away from the Micro-LEDs, of the first substrate by using the laser, the method further comprises:
    installing an electrostatic chuck below the second substrate.

15. The mass transfer method as claimed in claim 14, wherein a material of the mass transfer device is an antistatic material.

16. A mass transfer method, applied to the mass transfer device as claimed in claim 2, and used for transferring Micro-LEDs from a first substrate to a second substrate, wherein the mass transfer method comprises:
    placing the first substrate with multiple Micro-LEDs above the first surface of the mass transfer device, and making each Micro-LED on the first substrate respectively correspond to each first opening on the mass transfer device;
    placing the second substrate below the second surface of the mass transfer device, and making each Micro-LED to-be-installed position on the second substrate respectively correspond to each second opening on the mass transfer device; and
    irradiating one side, away from the Micro-LEDs, of the first substrate by using a laser, so that the multiple Micro-LEDs are separated from the first substrate and respectively entering the channels of the mass transfer device through the first openings, and falling into the Micro-LED to-be-installed positions on the second substrate via the second openings;
    wherein the first substrate is a transparent substrate.

17. The mass transfer method as claimed in claim 4, wherein the second substrate is provided with through holes, before irradiating one side, away from the Micro-LEDs, of the first substrate by using the laser, the method further comprises:
    installing a vacuum device below the second substrate, and forming vacuum below the second substrate by the vacuum device.

18. The mass transfer method as claimed in claim 5, wherein the second substrate is provided with through holes, before irradiating one side, away from the Micro-LEDs, of the first substrate by using the laser, the method further comprises:
    installing a vacuum device below the second substrate, and forming vacuum below the second substrate by the vacuum device.

19. The mass transfer method as claimed in claim 6, wherein the second substrate is provided with through holes, before irradiating one side, away from the Micro-LEDs, of the first substrate by using the laser, the method further comprises:
    installing a vacuum device below the second substrate, and forming vacuum below the second substrate by the vacuum device.

20. The mass transfer method as claimed in claim 7, wherein the second substrate is provided with through holes, before irradiating one side, away from the Micro-LEDs, of the first substrate by using the laser, the method further comprises:

installing a vacuum device below the second substrate, and forming vacuum below the second substrate by the vacuum device.

\* \* \* \* \*